United States Patent [19]

Lin

[11] Patent Number: 4,837,126
[45] Date of Patent: Jun. 6, 1989

[54] POLYMER COMPOSITION FOR PHOTORESIST APPLICATION

[75] Inventor: Wei Y. Lin, Marietta, Ga.

[73] Assignee: W. R. Grace & Co., Lexington, Mass.

[21] Appl. No.: 742,261

[22] Filed: Jun. 7, 1985

[51] Int. Cl.$^4$ ............................................. G03C 1/70
[52] U.S. Cl. ............................. 430/284; 430/285; 430/287; 522/93; 522/104; 522/106; 522/108; 522/904; 522/905; 525/10; 525/33; 525/921
[58] Field of Search .................. 430/287, 285, 284; 525/10, 33, 921; 522/93, 104, 106, 108, 904, 905

[56] References Cited

U.S. PATENT DOCUMENTS

| Re. 30,102 | 9/1979 | Thomas et al. | 525/437 |
|---|---|---|---|
| 3,429,852 | 2/1969 | Skoultchi | 260/47 |
| 3,574,617 | 4/1971 | Skoultchi | 96/35.1 |
| 3,631,154 | 12/1971 | Kawaguchi et al. | 250/76 |
| 3,647,470 | 3/1972 | Tsuda | 96/115 |
| 3,677,920 | 7/1972 | Kai et al. | 204/159.15 |
| 3,704,255 | 11/1972 | Braun | 260/404.8 |
| 3,840,390 | 10/1974 | Kozu et al. | 117/93.31 |
| 3,926,638 | 12/1975 | Rosen et al. | 96/115 |
| 3,926,639 | 12/1975 | Rosen et al. | 96/115 |
| 3,926,640 | 12/1975 | Rosen | 96/115 |
| 3,926,641 | 12/1975 | Rosen | 96/115 |
| 3,933,746 | 1/1976 | Steele | 260/47 |
| 4,008,138 | 2/1977 | Rosen et al. | 204/159.14 |
| 4,028,204 | 6/1977 | Rosen et al. | 204/159.14 |
| 4,138,299 | 2/1979 | Bolgiano | 204/159.16 |
| 4,158,618 | 6/1979 | Pastor | 204/159.16 |
| 4,158,730 | 6/1979 | Baumann et al. | 522/904 X |
| 4,283,480 | 8/1981 | Davies et al. | 430/270 |
| 4,321,319 | 3/1982 | Shoji et al. | 430/270 |
| 4,414,277 | 11/1983 | Oxenrider | 428/395 |
| 4,416,973 | 11/1983 | Goff | 430/281 |
| 4,421,894 | 12/1983 | O'Connor et al. | 525/28 |
| 4,422,914 | 12/1983 | Tsao et al. | 204/159.19 |
| 4,442,198 | 4/1984 | Tsao et al. | 430/311 |
| 4,448,875 | 5/1984 | Lewis | 430/283 |
| 4,451,636 | 5/1984 | Tsao et al. | 528/75 |
| 4,454,220 | 6/1984 | Goff | 430/311 |
| 4,481,281 | 11/1984 | Tsao et al. | 430/284 |
| 4,483,759 | 11/1984 | Szycher et al. | 204/159.24 |
| 4,515,887 | 5/1985 | Davis | 522/905 X |

FOREIGN PATENT DOCUMENTS 1420261 10/1968 Fed. Rep. of Germany .

0058792 5/1979 Japan ................................. 430/285

OTHER PUBLICATIONS

Monsanto Industrial Chemicals Co., "Modaflow".
Patent Abstracts of Japan, vol. 3, No. 79 (C-51) (50), 6th Jul. 1979; of JP-A-54 54196 (Teijin K. K.) 28-0-4-1979.

Primary Examiner—Roland E. Martin
Assistant Examiner—Cynthia Hamilton
Attorney, Agent, or Firm—Stacey L. Channing; William L. Baker

[57] ABSTRACT

The novel polymers disclosed have the formula:

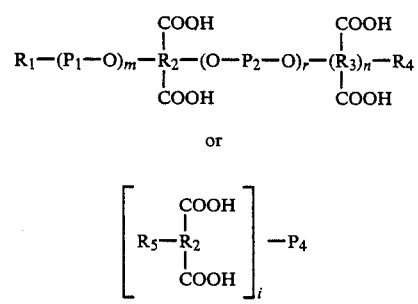

wherein $R_1$ is $R_5-(z)_p$; $R_5$ is a terminal reactive group $-O-$; z is —isocyanate—$O-$; p is zero or 1, however p is zero when m is zero; $P_1$ is an organic radical; m is zero or 1, however m is zero when n is 1; $R_2$ is an organic radical; i is an integer from 2 to 6; $P_2$ is an organic radical; r is zero or 1, however r is zero only when m is zero and n is zero; $R_3$ is an organic radical; $P_4$ is the residue from a polyhydroxy compound; n is zero or 1; $R_4$ is $-(v)_w-R_6$; v is —O—isocyanate; w is zero or 1, however, w is zero when m is zero; and $R_6$ is —O— terminal reactive group. The polymers are preferably made by first reacting a dianhydride with a polymer having terminal hydroxy groups and then reacting the reaction product with a hydroxy group terminated acrylate or methacrylate or a hydroxy group terminated hydrogen donor containing at least one heterogeneous atom such as O, N, or S. Polymer compositions comprising these polymers have been found to be very useful as photoresists in producing printed circuit boards.

6 Claims, No Drawings

POLYMER COMPOSITION FOR PHOTORESIST APPLICATION

BACKGROUND OF THE INVENTION

This invention relates to novel polymers and the use of these polymers alone and in conjunction with other materials as photoresists. More particularly, this invention is directed to polymers having the formula:

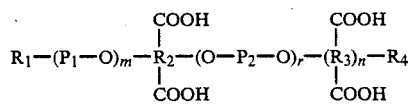

or

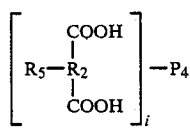

wherein $R_1$ is $R_5-(z)_p$; $R_5$ is terminal reactive group —O—; z is isocyanate —O—; p is zero or 1, however p is zero when m is zero; $P_1$ is an organic radical; m is zero or 1, however m is zero when n is 1; $R_2$ is an organic radical; $P_2$ is an organic radical; r is zero or 1, however r is zero only when m is zero and n is zero; $R_3$ is an organic radical; n is zero or 1; $R_4$ is $-(v-)_w-R_6$; v is —O— isocyanate—; w is zero or 1, however, w is zero when m is zero; $R_6$ is —O— terminal reactive group; i is an integer from 2-6; and $P_4$ is the residue from a polyhydroxy compound.

The essence of photoresist processes is the use of a material which after exposure to actinic radiation can be removed from certain parts of the circuit board blank, but not from other areas. The material must be capable of sharp resolution, i.e., it must be a material where the exposed areas and the unexposed areas are clearly and sharply defined. There must also be good adhesion of the cured material to the underlying metal in order that excess metal not be removed during the etching step.

Many polymers, such as those disclosed in U.S. Pat. No. 4,422,914, can be successfully used as photoresists. However, the above-identified essential properties of image quality, adhesion and strippability have been improved upon by the polymers of this invention.

It has previously been found desirable, for fast and efficient curing of such polymers to include with the system relatively large amounts of a photoinitiating component. Even in systems wherein these large amounts of photoinitiators are compatible, most of the photoinitiator will remain chemically unbonded in the final cured composition, producing deleterious effects on the properties of these cured materials. An additional drawback to the use of high levels of photoinitiators is the possibility of the occurrence of side reactions by the unbonded portions of the photoinitiators on exposure to actinic radiation.

Accordingly, it is a principal object of this invention to provide a polymer, which when used in a photopolymerizable composition as a photoresist, will produce a printed circuit board with sharp definition.

It is another object of this invention to provide such a polymer, which when used as a photoresist, can be removed in its uncured state by the use of an aqueous solution.

It is another object of this invention to provide such a polymer, which when used as a photoresist and cured, will have good adhesion to the underlying substrate of the circuit board.

It is another object of this invention to provide such a polymer, which when used as a photoresist and cured, is susceptable to stripping using alkaline solutions.

It is a further object of this invention to provide such a polymer which has a photoinitiating component incorporated into its backbone.

SUMMARY OF THE INVENTION

The polymers of the present invention are characterized by the formula:

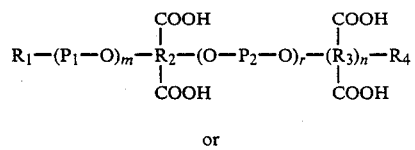

or

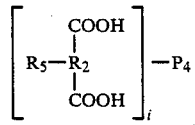

wherein $R_1$ is $R_5-(z)_p$; $R_5$ is terminal reactive group —O—; z is isocyanate —O—; p is zero or 1, however p is zero when m is zero; $P_1$ is an organic radical; m is zero or 1, however m is zero when n is 1; $R_2$ is an organic radical; i is an integer from 2 to 6; $P_2$ is an organic radical; r is zero or 1, however r is zero only when m is zero and n is zero; $R_3$ is an organic radical; $P_4$ is the residue from a polyhydroxy compound; n is zero or 1; $R_4$ is $-(v)_w-R_6$; v is —O— isocyanate—; w is zero or 1, however, w is zero when m is zero; and $R_6$ is —O— terminal reactive group.

Preferably, in the above formula, p is zero, w is zero, m is zero, r is 1, and n is 1. $R_5$ is preferably

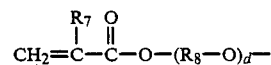

or $R_{13}-(A-R_{14})_f-O-$ wherein $R_7$ is hydrogen, methyl, or ethyl; $R_8$ is a straight or branched chain alkyl group of from 1 to 6 carbon atoms; d is an integer from 1 to 10; $R_{13}$ is alkyl or the remainder of a heterocyclic ring system containing A as the heterocyclic moiety; A is O, N or S; $R_{14}$ is alkyl or aryl; and f is an integer from 1 to 6. $R_6$ is preferably

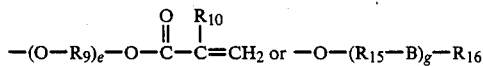

wherein $R_9$ is a straight or branched chain alkyl group of from 1 to 6 carbon atoms; e is an integer from 1 to 10; $R_{10}$ is hydrogen, methyl or ethyl; $R_{15}$ is alkyl or aryl; B is O, N, or S; g is an integer from 1 to 6; and $R_{16}$ is alkyl or the remainder of a heterocyclic ring system containing B as the heterocyclic moiety. $R_2$ preferably comprises

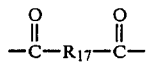

and $R_3$ preferably comprises

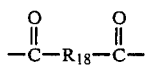

wherein $R_{17}$ and $R_{18}$ are organic radicals. More preferably $R_2$ and $R_3$ comprise

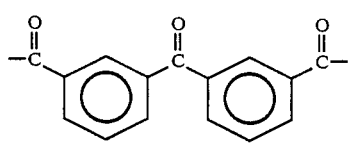

These polymers can be synthesized in various ways. However, a preferred route is to react a dianhydride with a polymer having terminal hydroxy groups and then react the reaction product with a hydroxy group terminated mono or multi-functional acrylate or methacrylate or a hydroxy group terminated hydrogen donor containing at least one heterogeneous atom such as O, N or S. These polymers have uses other than as photoresists. They can be used as overcoatings, printing or decorative coatings, protective coatings etc. For example, if a surface which has been treated with these polymers and cured is subsequently coated with spray paint and pencil art, the polymer coating, along with the spray paint and pencil, can be removed by a caustic stripping.

DESCRIPTION OF THE PREFERRED EMBODIMENT

The polymers of the invention have the formula:

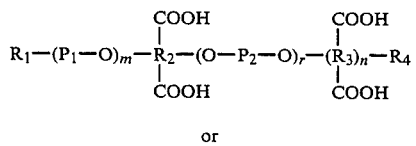

or

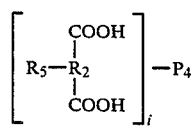

wherein $R_1$ is $R_5-(z)_p$; $R_5$ is terminal reactive group —O—; z is isocyanate —O—; p is zero or 1, however p is zero when m is zero; $P_1$ is an organic radical; m is zero or 1, however m is zero when n is 1; $R_2$ is an organic radical; i is an integer from 2 to 6; $P_2$ is an organic radical; r is zero or 1, however r is zero only when m is zero and n is O; $R_3$ is an organic radical; $P_4$ is the residue from a polyhydroxy compound; n is zero or 1; $R_4$ is —$(v)_w$—$R_6$; v is —O— isocyanate—; w is zero or 1, however, w is zero when m is zero; and $R_6$ is —O— terminal reactive group.

Preferably, in the above formula, p is zero, w is zero, m is zero, r is 1, and n is 1. $R_5$ is preferably

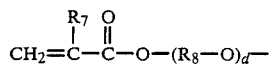

or $R_{13}$—(A—$R_{14})_f$—O— wherein $R_7$ is hydrogen, methyl, or ethyl; $R_8$ is a straight or branched chain alkyl group of from 1 to 6 carbon atoms; d is an integer from 1 to 10; $R_{13}$ is alkyl or the remainder of a heterocyclic ring system containing A as the heterocyclic moiety; A is O, N or S; $R_{14}$ is alkyl or aryl; and f is an integer from 1 to 6. $R_6$ is preferably

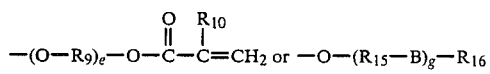

wherein $R_9$ is a straight or branched chain alkyl group of from 1 to 6 carbon atoms; e is an integer from 1 to 10; $R_{10}$ is hydrogen, methyl or ethyl; $R_{15}$ is alkyl or aryl; B is O, N, or S; g is an integer from 1 to 6; and $R_{16}$ is alkyl or the remainder of a heterocyclic ring system containing B as the heterocyclic moiety. When $R_5$ has the structure $R_{13}$—(A—$R_{14})_f$—O—; $R_5$ is preferably $CH_3$—O—$CH_2$—$CH_2$—O—, $CH_3$—O—$CH_2CH_2$—O—$CH_2CH_2$—O—, or

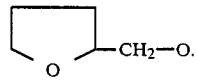

When $R_6$ has the structure —O—$(R_{15}-B)_g$—$R_{16}$, $R_6$ is preferably —O—$CH_2$—$CH_2$—O—$CH_3$, —O—$CH_2$—$CH_2$—O—$CH_2$—$CH_2$—O—$CH_3$, or

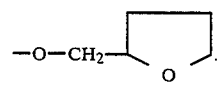

$P_1$ is preferably alkylene, polyether, polyester, polycarbonate or mixtures thereof comprising from 1 to 50 repeating units. $P_2$ is preferably alkylene, polyether, polyester, polycarbonate or mixtures thereof comprising from 1 to 50 repeating groups. The preferred formula for z is

wherein $R_{11}$ is alicyclic, alkyl or aryl and the preferred formula for v is

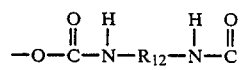

wherein $R_{12}$ is alicylic, alkyl or aryl. $R_2$ preferably comprises

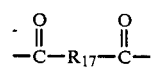

and $R_3$ preferably comprises

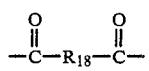

wherein $R_{17}$ and $R_{18}$ are organic radicals. More preferably, $R_2$ and $R_3$ are

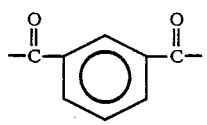

wherein T can be

$-CH_2-, -S-, -O-$, or $-SO_2-$, but is preferably

$P_4$ is preferably polyether, polyester, polycarbonate, or mixtures thereof comprising from 1 to 50 repeating units. $P_4$ may be a multi-functional group such as:

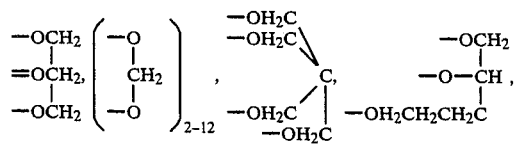

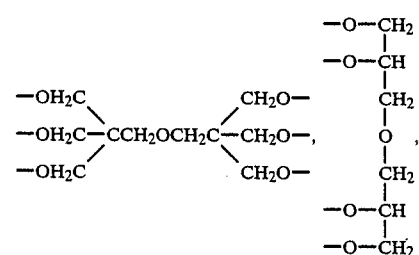

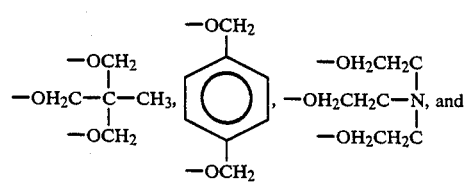

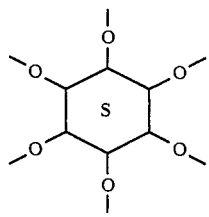

In the use of the polymers of this invention as photoresists, the carboxyl groups of the polymers provide for strippability of the cured photoresist using concentrated alkaline solutions, good adhesion of the cured photoresist to the underlying substrate of a circuit board, and removability of the uncured photoresist using an aqueous solution. The preferred polymers of the invention are those that have an ester type linkage instead of a urethane linkage. The ester type linkage allows for carboxyl group benefits without reactive urethane properties.

In synthesizing polymers having the above structures, any components which can produce a polymer having said structure can be used. These polymers can be synthesized in many ways. The proportions of the reactants employed will vary depending upon the number of reactive sites available on the polymer and the degree of substitution required. Also, it is a matter of ordinary preparative experience on the part of the practitioner to determine the precise combination of time and temperature which will be best suited for the synthesis of the specific polymer.

A preferred way for preparing polymers of the invention having the formula:

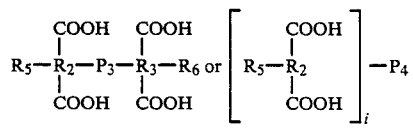

wherein $R_5$ is

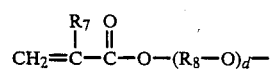

or $R_{13}-(A-R_{14})_f-O$; $R_7$ is hydrogen, methyl, or ethyl; $R_8$ is a straight or branched chain alkyl group of from 1 to 6 carbon atoms; d is an integer from 1 to 10; $R_{13}$ is alkyl or the remainder of a heterocyclic ring system containing A as the heterocyclic moiety; A is O, N, or S; $R_{14}$ is alkyl or aryl; f is an integer from 1 to 6; $R_2$ is an organic radical; i is an integer from 2 to 6; $P_3$ is the residue from an organic compound having terminal hydroxy groups; $P_4$ is the residue from a polyhydroxy compound; $R_3$ is an organic radical; $R_6$ is

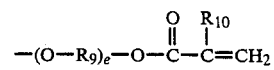

or $-O-(R_{15}-B)_g-R_{16}$; $R_9$ is a straight or branched chain alkyl group of from 1 to 6 carbon atoms; e is an integer from 1 to 10; $R_{10}$ is hydrogen, methyl, or ethyl; $R_{15}$ is alkyl or aryl; B is O, N, or S; g is an integer from 1 to 6; and $R_{16}$ is alkyl or the remainder of a heterocyclic ring system containing B as the heterocyclic moiety is by first providing a polymer having terminal hydroxy groups (polyol). The term terminal hydroxy group signifies a group which is not bound towards the center of the polymer molecule, but rather the hydroxy group is either isolated at the end of the polymer or at least at the end of a substituent branch if it is incorporated into a large polymeric molecule. Accordingly, if the polymer having terminal hydroxy groups was not multifunctional, it would have a hydroxy group isolated at both ends of the polymer. Among the useful polyols are included polyethers, polyesters, polycarbonates and mixtures thereof comprising from 1 to 50 repeating units. The polyether, polyester or polycarbonate can have essentially any structure as long as it either has the reactive capability at both ends or at the ends of at least two of its branches to undergo reaction with an anhydride group. The polyester, polyether, or polycarbonate preferably has a molecular weight of 250 to 10,000. Polyesters and polyethers are the preferred polymers having terminal hydroxy groups and suitable polyesters and polyethers, among others, include poly(diethylene glycol adipate), poly(ethylene glycol adipate), poly(ethylene oxide), poly(propylene oxide), poly(tetra methylene oxide), poly(ethylene oxide-propylene oxide) copolymer, poly(neopentyl glycol adipate), poly(nonamethylene oxide), and poly(caprolactone). Suitable multi-functional polymers having terminal hydroxy groups include trimethylolpropane, pentaerythritol, and dipentaerythritol. The preferred polymers having terminal hydroxyl groups are poly(diethylene glycol adipate) and poly(tetra methylene oxide).

The polymer having terminal hydroxy group (polyol) is mixed with at least a two fold equivalent excess of a dianhydride, i.e. at least two anhydride groups are provided per terminal hydroxy group, and the same is reacted until the terminal hydroxy groups of the polyol are reactively consumed. The reaction mixture is preferably heated up to between 160° C. to 200° C. and maintained at that temperature for about 4 hours. The reaction can be catalyzed with acid such as phosphoric acid or any other carboxylic acid such as B-carboxyl ethyl acrylate, maleic acid adduct, etc. The catalyst concentration used can range from 500 ppm to 50 percent by weight; however, the preferred catalyst concentration is between 0.1 to 5 percent by weight. Suitable dianhydrides include benzophenone tetracarboxylic acid dianhydride (benzophenone dianhydride), pyromellitic dianhydride, and benzophenyl tetracarboxylic acid dianhydride. The remaining unreacted anhydride groups are available for further reaction.

The temperature of the reactor is then preferably dropped to between 90° C. to 160° C. and more preferably between 110° C. and 130° C., and a hydroxy group terminated mono or multi-functional acrylate or methacrylate or a hydroxy group terminated hydrogen donor containing at least one heterogeneous atom such as S, O or N is added to the dianhydride and polyol reaction product in an amount sufficient to react with the unreacted anhydride groups, i.e. at least one hydroxy group is provided per unreacted anhydride group, and the same is reacted until the anhydride content of the reaction mixture is exhausted. This point of completion of reaction can be determined by infrared analysis. The reaction mixture is preferably maintained at between 90° C. to 160° C., more preferably 110° C. to 130° C., for about 4 hours. The reaction mixture is preferably prevented from gelling by adding an inhibitor such as 2,6di-t-butyl phenol or hydroquinone monomethyl ether in a preferred amount by weight of from 0.05 to 0.2 percent.

Suitable hydroxy terminated acrylates or methacrylates include hydroxyethyl acrylate, hydroxypropyl acrylate, hydroxybutyl acrylate, hydroxyisobutyl acrylate, hydroxyisopentyl acrylate, hydroxyhexyl acrylate, polypropylene glycol monoacrylate, polyethylene glycol monoacrylate, hydroxyethyl methacrylate, hydroxypropyl methacrylate, hydroxybutyl methacrylate, hydroxyisobutyl methacrylate, hydroxypentyl methacrylate, polypropylene glycol monomethacrylate, and polyethylene glycol monomethacrylate. A preferred hydroxy terminated methacrylate is hydroxyethyl methacryalate. The terminal alkene group of the acrylate or methacrylate provides the synthesized polymer with the capability for free radical polymerization.

Suitable hydroxy group terminated hydrogen donors include tetrahydrofurfuryl alcohol, methoxyethanol, 2-ethoxyethanol, 2-butoxyethanol, diethylene glycol methyl ether, diethylene glycol ethyl ether, and diethylene glycol butyl ether. Preferred hydroxy terminated hydrogen donors include tetrahydrofurfuryl alcohol, methoxyethanol and diethylene glycol methyl ether.

Whether the synthesized polymer will be a liquid or a solid is primarily determined by the chain length and molecular weight of the polyol unit. Reactive diluent (diluent that will crosslink when the polymer is cured) can be added to the synthesized polymer to reduce its viscosity. Examples of reactive diluent that can be added are propoxylated neopentyl glycol diacrylate, trimethanol propane triacrylate, propoxylated trimethanol propane triacrylate, tripropylene glycol diacrylate, 2-ethoxyethylacrylate and phthalic anhydride and hydroxyethyl methacrylate (HEMA) adduct.

An alternate way of preparing the above-prepared polymers would be to react the hydroxy group terminated mono or multi-functional acrylate or methacrylate or the hydroxy group terminated hydrogen donor containing at least one heterogeneous atom such as S, O, or N with at least a two fold equivalent excess of dianhydride, i.e., at least two anhydride groups are provided per terminal hydroxy group, until the terminal hydroxy groups of the acrylate, methacrylate, or hydrogen donor are reactively consumed. The reaction mixture is preferably heated up to between 130° C. to 160° C. and maintained at that temperature for about 4 hours. Since the mixture to be reacted is very viscous, a diluent, preferably a glycol polar diluent which will solubilize the dianhydride, is added to the reaction mixture. The reaction can be catalyzed with suitable catalysts such as stannous octoate, phosphoric acid or any other carboxylic acid such as B-carboxyl ethyl acrylate, maleic acid adduct, etc. Also, an inhibitor, such as 2,6di-t-butyl phenol or hydroquinone monomethyl ether is preferably added to the reaction mixture to prevent if from gelling. The remaining unreacted anhydride groups are available for further reaction. The temperature of the reactor is then preferably dropped to between 110° C. and 130° C. and the polymer having terminal hydroxy groups (polyol) is then added to the reaction product in an amount sufficient to provide a number of reactive hydroxy groups approximately equivalent to the number of remaining unreacted anhydride groups in the above reaction product and the same is reacted until the anhydride content of the reaction mixture is exhausted. This point of completion of reaction can be determined by infrared analysis. The reaction mixture is preferably maintained between 110° C. to 130° C. for 4 hours.

One way for preparing polymers of the invention with less amounts of carboxylic acid groups, which polymers have the formula:

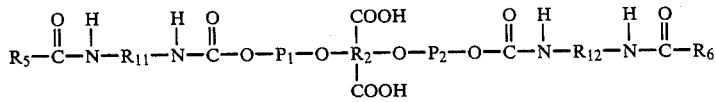

wherein $R_5$ is

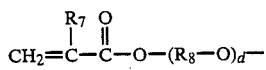

or $R_{13}—(A—R_{14})_f—O$, $R_7$ is hydrogen, methyl, or ethyl; $R_8$ is a straight or branched chain alkyl group of from 1 to 6 carbon atoms; d is an integer from 1 to 10; $R_{13}$ is alkyl or the remainder of a heterocyclic ring system containing A as the heterocyclic moiety; A is O, N, or S; f is an integer from 1 to 6; $R_{11}$ is alicyclic, alkyl, or aryl; $P_1$ is an organic radical; $R_2$ is an organic radical; $P_2$ is an organic radical; $R_{12}$ is alicyclic, alkyl, or aryl; $R_6$ is

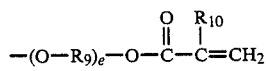

or $—O—(R_{15}—B)_g—R_{16}$; $R_9$ is a straight or branched chain alkyl group of from 1 to 6 carbon atoms; e is an integer from 1 to 10; $R_{10}$ is hydrogen, methyl, or ethyl; $R_{15}$ is alkyl or aryl; B is O, N, or S; g is an integer from 1 to 6; and $R_{16}$ is alkyl or the remainder of a heterocyclic ring system containing B as the heterocyclic moiety is by first providing a dianhydride. The dianhydride is mixed with at least a two fold equivalent excess of a polymer having terminal hydroxy groups (polyol), i.e. at least two hydroxy groups are provided per anhydride group, and the same is reacted until the anhydride content of the reaction mixture is exhausted. This point of completion of reaction can be determined by infrared analysis. The remaining unreacted hydroxy groups are available for further reaction.

A two fold equivalent excess of an organic diisocyanate is next added to the reaction product, i.e. at least two isocyanate groups per unreacted hydroxy group, and the same is reacted until all of the remaining hydroxy groups of the reaction product have been reactively consumed. The remaining unreacted isocyanate groups are available for further reaction. Any diisocyanate which can produce a polymer having the above general structure can be used. This diisocyanate has the general formula R(NCO)$_2$ where R is a polyvalent organic moiety free from reactive carbon to carbon unsaturation. Preferred diisocyanates are hexamethylene diisocyanate, diphenylmethane diisocyanate, phenylene diisocyanate, toluene diisocyanate, xylylene diisocyanate, naphthalene diisocyanate, and isophorene diisocyanate.

Lastly, a hydroxy group terminated mono or multifunctional acrylate or methacrylate or a hydroxy group terminated hydrogen donor containing at least one heterogeneous atom such as S, O, or N, as described previously, is added to the reaction product (urethane adduct) in an amount sufficient to provide a number of reactive hydroxy groups approximately equivalent to the number of remaining unreacted isocyanate groups and the same is reacted until all of the isocyanate content of said urethane adduct is reactively consumed. A catalyst is preferably used in the reaction and can be admixed with the diisocyanate. Suitable catalysts are urethane catalysts such as dibutyl tin dilaurate or stannous octoate. A catalyst promotor such as an organic phosphite can also be used.

A preferred alternate way of preparing the above-prepared polymers with less amounts of carboxylic acid groups would be to react the hydroxy group terminated mono or multi-functional acrylate or methacrylate or hydroxy terminated hydrogen donor with about a two fold equivalent excess of diisocyanate, i.e. at least two isocyanate groups are provided per terminal hydroxy group, until the terminal hydroxy groups of the acrylate, methacrylate, or hydrogen donor are reactively consumed. The remaining unreacted isocyanate groups are available for further reaction. A two fold equivalent excess of the polymer having terminal hydroxy groups is next added to the reaction product, i.e. at least two terminal hydroxy groups are provided per unreacted isocyanate group and the same is reacted until all of the isocyanate content of the reaction product is reactively consumed. The remaining unreacted terminal hydroxy groups are available for further reaction. Lastly, the dianhydride is added to the reaction product in an amount sufficient to provide a number of anhydride groups approximately equivalent to the number of remaining unreacted terminal hydroxy groups and the same is reacted until the anhydride content of the reaction mixture is exhausted.

One way of preparing polymers of the invention with no polyol component, which polymers have the formula:

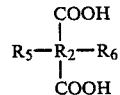

wherein $R_5$ is

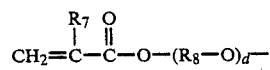

or $R_{13}—(A—R_{14})_f—O$; $R_7$ is hydrogen, methyl, or ethyl; $R_8$ is a straight or branched chain alkyl group of from 1 to 6 carbon atoms; d is an integer from 1 to 10; $R_{13}$ is alkyl or the remainder of a heterocyclic ring system containing A as the heterocyclic moiety; A is O, N, or S; $R_{14}$ is alkyl or aryl; f is an integer from 1 to 6; $R_2$ is an organic radical; $R_6$ is

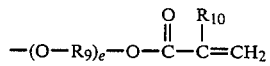

or $-O-(R_{15}-B)_g-R_{16}$; $R_9$ is a straight or branched chain alkyl group of from 1 to 6 carbon atoms; e is an integer from 1 to 10; $R_{10}$ is hydrogen, methyl, or ethyl; $R_{15}$ is alkyl or aryl; B is O, N, or S; g is an integer from 1 to 6; and $R_{16}$ is alkyl or the remainder of a heterocyclic ring system containing B as the heterocyclic moiety is by first providing a dianhydride. The dianhydride is mixed with a hydroxy group terminated acrylate or methacrylate or a hydroxy group terminated hydrogen donor containing at least two heterogeneous atom such as S, O, or N in an amount sufficient to provide a number of reactive hydroxy groups approximately equivalent to the number of reactive anhydride groups and the same is reacted until the anhydride content of the reaction mixture is exhausted.

The polymers of the invention can be used by themselves as photoresists or can be formulated into photopolymerizable compositions in a conventional manner known to those skilled in the art, such as that disclosed in U.S. Pat. No. 4,422,914, the teachings of which are incorporated herein by reference. These photopolymerizable compositions can be applied to a substrate as a liquid, a solid, or a hot melt.

In the use of the polymers of the invention as photopolymerizable compositions, a photoinitiator may be used along with the actinic light for polymerization. Useful photoinitiators include benzophenone, acetophenone, acenaphthenequinone, 1-phenyl-1,1-dimethoxyacetophenone, o-methoxy benzophenone, dibenzosuberone, anthraquinone, hexanophenone, and 2,2dimethoxy-2-phenyl acetophenone. When a photosensitizer such as benzophenone dianhydride is used in the synthesis of the polymers of the invention, it is not necessary to include a photoinitiator in the photopolymerizable composition, as a photosensitizer will be incorporated into the polymer backbone. If a photosensitizer such as benzophenone dianhydride is used in the synthesis of a polymer of the invention and no hydroxy group terminated hydrogen donor containing at least one heterogeneous atom such as S, O, or N, as described previously, is used, it would be necessary to include a hydrogen donor containing at least one heterogeneous atom as a coinitiator in the photopolymerizable composition in order for the photopolymerizable composition to have photoininiator properties. Suitable coinitiators include those hydroxy terminated hydrogen donors described previously as well as tetrahydrofurfuryl acrylate, 2-ethoxyethyl acrylate and aminoacrylate. If a hydroxy group terminated hydrogen donor containing at least one heterogeneous atom such as S, O, or N and benzophenone dianhydride are both used in the synthesis of a polymer of the invention, no photoinitiator or coinitiator would be needed to be included in the photopolymerizable composition, as the entire photoinitiator component, the photosensitizer and the coinitiator, would be incorporated into the backbone of the polymer.

When the photosensitizer and the coinitiator are incorporated into the backbone of the polymer (both have no mobility), uniform photoinitiation will take place, thus providing improved speed and image quality. There will be no photoinitiator left unbonded in the final cured composition and there will be no occurrence of side reactions by the unbonded portions of the photoinitiators on exposure to actinic radiation. When the photosensitizer alone is incorporated into the backbone of the polymer, the image quality will be improved due to the nonmobility of said photosensitizer; however, the benefits will not be as great as when both the photosensitizer and the coinitiator are incorporated into the polymer backbone.

Depending on the specific intended use for the polymers, other materials besides those already set out can be used in the photopolymerizable composition. For instance, if it is desired to thicken the polymer to make a screen-printable ink, an inorganic filter may be added. The photopolymerizable composition may also contain one or more flow promoting agents and typical of such flow promoting agents are Modaflow, an acrylic resin-based material sold by Monsanto, and Resiflow L, an acrylic resin-based material sold by SBS Chemicals Inc. As discussed previously, reactive diluent can be included in the photopolymerizable composition in order to reduce the viscosity.

A preferred formulation for the photopolymerizable composition which can be used either as an etch resist or plate resist would be as follows:

| Component | Percent by Weight |
|---|---|
| Polymer | 15–70 |
| 2-ethoxyethylacrylate | 0–30 |
| trimethanolpropane triacrylate or propoxylated trimethanolpropane triacrylate | 0–30 |
| Phthalic anhydride and hydroxyethyl methacrylate adduct | 0–50 |
| Resiflow L | 1–2 |
| Dye | 0–1 |
| B-carboxylethyl acrylate | 0–10 |
| Irgacure 651 (1-phenyl-1, 1-dimethoxy-acetophenone) | 0–5 |

Other reactive diluent, such as propoxylated neopentyl glycol diacrylate or tripropylene glycol diacrylate can be used in place of the trimethanol propane triacrylate or propoxylated trimethanol propane triacrylate component.

Three possible specific formulations for the photopolymerizable composition would be as follows:

| | Percent by Weight | | |
|---|---|---|---|
| Component | (1) | (2) | (3) |
| Polymer | 60 | 30 | 50 |
| 2-ethoxyethylacrylate | 13.5 | 0 | 25 |
| trimethanol propane triacrylate | 20.0 | 0 | 20 |
| phthalic anhydride/HEMA adduct | 0 | 50 | 0 |
| tripolypropylene glycol diacrylate | 0 | 15 | 0 |
| B-carboxylethyl acrylate | 5.0 | 0 | 3.0 |
| Irgacure 651 | 0 | 3.0 | 3.0 |
| Resiflow | 1.0 | 1.5 | 1.5 |
| Dye | 0.5 | 0.5 | 0.5 |

In the use of the polymers of the invention in photoresist compositions, the photopolymerizable composition may be coated onto a metal or other substrate clad circuit board blank by a conventional technique. That is, the photopolymerizable composition can be thickened and applied to parts of the circuit board blank by screen printing, or it can be applied to the full circuit board blank and in a later step be selectively imaged. When the photopolymerizable composition is screen printed onto the circuit board blank, it need only be exposed to actinic light for it to cure. This cured composition then protects the underlying substrate during the subsequent plate resist or etch resist processing steps. When the photopolymerizable composition is applied to the circuit board blank and selectively imaged, the selective curing is accomplished by placing a photo tool, usually a negative of a circuit design which has opaque areas and transparent areas, above the coated surface, if the photopolymerizable composition is liquid, or in contact with the coated surface, if the photopolymerizable composition is solid. Actinic light is then focused onto the photo tool, passes through the photo tool in the transparent areas and cures the photopolymerizable composition which it contacts. If a liquid photopolymerizable composition is used, the composition which is not contacted by the light remains liquid and is removed by wiping or by an alkaline wash. The cured composition is firmly attached to the metal or other substrate of the circuit board blank and protects the underlying substrate during the subsequent plate resist or etch resist processing steps. Whether screen printing or any other wet technique is used, the cured composition is stripped from the surface which it protects in the same manner. This consists of contacting the circuit board blank with an alkaline solution which contains cations derived from a strong base.

The invention is further illustrated by the following non-limiting examples:

EXAMPLE 1

This example sets forth a process for making a liquid polymer composition of the invention.

A reactor is preheated to between 95° C. to 105° C. and 40.36 parts by weight of poly(diethylene glycol adipate) and 25.97 parts by weight of benzophenone tetracarboxylic acid anhydride (BTDA) are added to the reactor. The mixture is agitated and the temperature is increased to between 160° C. to 170° C. 0.015 parts by weight of stannous octoate is added to the mixture and the mixture is maintained at between 160° C. to 170° C. for 4 hours until the terminal hydroxy groups are consumed.

The temperature of the reactor is dropped to between 115° C. to 125° C. and 2.0 parts by weight of B-carboxyl ethyl acrylate (B-CEA) and 1.5 parts by weight of 2,6-Di-t-butyl phenol, are added to the reaction product and blended for 1.5 hours. Next, 11.50 parts by weight of hydroxyethyl methacrylate (HEMA) and 0.05 parts by weight of hydroquinone monomethyl ether (MEHQ) are added to the reaction product and blended for 3 hours until the anhydride content of the reaction mixture is exhausted.

20.0 parts by weight of reactive diluent, specifically tripropylene glycol diacrylate, is added to the above-prepared synthesized polymer of the invention and blended for 1 hour.

EXAMPLE 2

This example sets forth another process for making a polymer composition of the invention.

A reactor is preheated to between 75° C. to 85° C. and 33.257 parts by weight of hydroxyethyl methacrylate (HEMA) and 37.421 parts by weight of benzophenone tetracarboxylic acid dianhydride (BTDA) are added to the reactor. The mixture is agitated and there is added to the mixture 2.16 parts by weight of B-CEA, 1.443 parts by weight of 2,6-Di-t-butyl phenol, and 0.014 parts by weight of stannous octoate. The temperature is increased to between 115° C. to 125° C. and maintained at that temperature for 5 hours until the anhydride content of the reaction mixture is exhausted, as indicated by the absence of 1790 cm$^{-1}$ and 1860 cm$^{-1}$ peaks in an IR spectrograph.

The temperature is decreased to between 75° C. to 85° C. and 14.399 parts by weight of 2-ethoxyethyl acrylate (reactive diluent) and 11.306 parts by weight of trimethanol propane triacrylate (reactive diluent) are added to the above-prepared synthesized polymer of the invention reaction product and blended for 1 hour.

While this invention has been described with reference to its preferred embodiment, other embodiments can achieve the same result. Variations and modifications of the present invention will be obvious to those skilled in the art and it is intended to cover in the appended claims all such modifications and equivalents as fall within the true spirit and scope of this invention.

What I claim is:

1. A photopolymerizable composition comprising 60 percent by weight polymer having the formula:

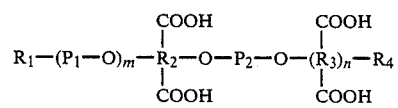

wherein $R_1$ is $R_5-(z)_p$; $R_5$ is

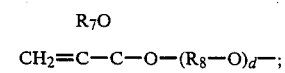

$R_7$ is hydrogen, methyl or ethyl; $R_8$ is a straight or branched chain alkyl group of from 1 to 6 carbon atoms; d is an integer from 1 to 10; z is

wherein $R_{11}$ is alicyclic, alkyl or aryl; p is zero or 1, however p is zero when m is zero and p is 1 when m is 1; $P_1$ is an organic radical; m is zero or 1, however m is zero when n is 1 and m is 1 when n is zero; $R_2$ is an organic radical; $P_2$ is an organic radical; $R_3$ is an organic radical; n is zero or 1; $R_4$ is $-(v)_w-R_6$; v is

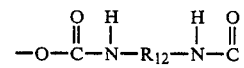

wherein $R_{12}$ is alicyclic, alkyl or aryl; w is zero or 1, however w is zero when m is zero and w is 1 when m is 1; $R_6$ is

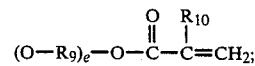

$R_9$ is a straight or branched chain alkyl group of from 1 to 6 carbon atoms; e is an integer from 1 to 10; and $R_{10}$ is hydrogen, methyl or ethyl; 13.5 percent by weight 2-ethoxyethylacrylate; 20 percent by weight trimethanol propane triacrylate; 1 percent by weight flow promoting agent; 0.5 percent by weight dye; and 5 percent by weight B-carboxyethyl acrylate.

2. A photopolymerizable composition comprising 50 percent by weight polymer having the formula:

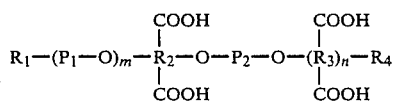

wherein $R_1$ is $R_5-(z)_p$; $R_5$ is

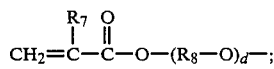

$R_7$ is hydrogen, methyl or ethyl; $R_8$ is a straight or branched chain alkyl group of from 1 to 6 carbon atoms; d is an integer from 1 to 10; z is

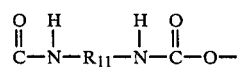

wherein $R_{11}$ is alicyclic, alkyl or aryl; p is zero or 1, however p is zero when m is zero and p is 1 when m is 1; $P_1$ is an organic radical; m is zero or 1, however m is zero when n is 1 and m is 1 when n is zero; $R_2$ is an organic radical; $P_2$ is an organic radical; $R_3$ is an organic radical; n is zero or 1; $R_4$ is $-(v)_w-R_6$; v is

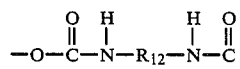

wherein $R_{12}$ is alicyclic, alkyl or aryl; w is zero or 1, however w is zero when m is zero and w is 1 when m is 1; $R_6$ is

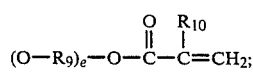

$R_9$ is a straight or branched chain alkyl group of from 1 to 6 carbon atoms; e is an integer from 1 to 10; and $R_{10}$ is hydrogen, methyl or ethyl; 25 percent by weight 2-ethroxyethylacrylate; 20 percent by weight trimethanol propane triacrylate; 1.5 percent by weight flow promoting agent; 0.5 percent by weight dye; 3 percent by weight B-carboxyethyl acrylate; and 3 percent by weight 1-phenyl-1,1-dimethoxyacetophenone.

3. A photopolymerizable composition comprising 30 percent by weight polymer having the formula:

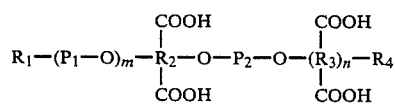

wherein $R_1$ is $R_5-(z)_p$; $R_5$ is

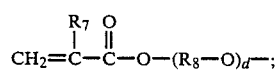

$R_7$ is hydrogen, methyl or ethyl; $R_8$ is a straight or branched chain alkyl group of from 1 to 6 carbon atoms; d is an integer from 1 to 10; z is

wherein $R_{11}$ is alicyclic, alkyl or aryl; p is zero or 1, however p is zero when m is zero and p is 1 when m is 1; $P_1$ is an organic radical; m is zero or 1, however m is zero when n is 1 and m is 1 when n is zero; $R_2$ is an organic radical; $P_2$ is an organic radical; $R_3$ is an organic radical; n is zero or 1; $R_4$ is $-(v)_w-R_6$; v is

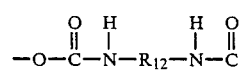

wherein $R_{12}$ is alicyclic, alkyl or aryl; w is zero or 1, however w is zero when m is zero and w is 1 when m is 1; $R_6$ is

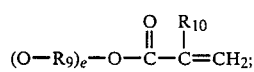

$R_9$ is a straight or branched chain alkyl group of from 1 to 6 carbon atoms; e is an integer from 1 to 10; and $R_{10}$ is hydrogen, methyl or ethyl; 50 percent by weight phthalic anhydride and hydroxyethyl methacrylate adduct; 15 percent by weight tripolypropylene glycol diacrylate; 1.5 percent by weight flow promoting agent; 0.5 percent by weight dye; and 3 percent by weight 1-phenyl-1,1-dimethoxyacetophenone.

4. A polymer having the formula:

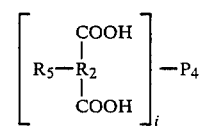

wherein $R_5$ is

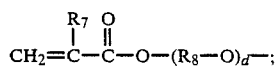

$R_7$ is hydrogen, methyl or ethyl; $R_8$ is a straight or branched chain alkyl group of from 1 to 6 carbon atoms; d is an integer from 1 to 10; $R_2$ comprises

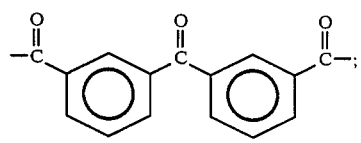

i is an integer from 3-6; and $P_4$ is selected from the group consisting of polyether, polyester, polycarbonate, and mixtures thereof comprising from 1 to 50 repeating units.

5. A polymer having the formula:

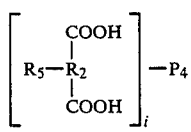

wherein $R_5$ is

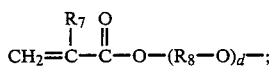

$R_7$ is hydrogen, methyl or ethyl; $R_8$ is a straight or branched chain alkyl group of from 1 to 6 carbon atoms; d is an integer from 1 to 10; $R_2$ is an organic radical; i is an integer from 2–6; and $P_4$ is a multifunctional group selected from the group consisting of:

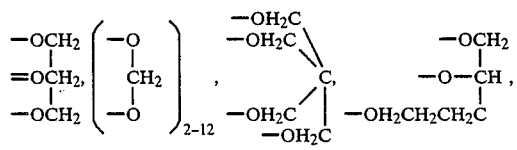

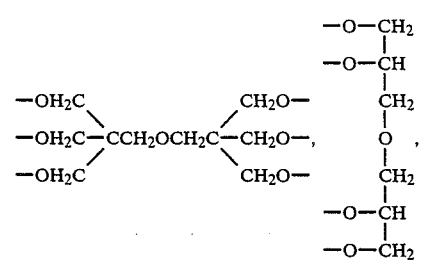

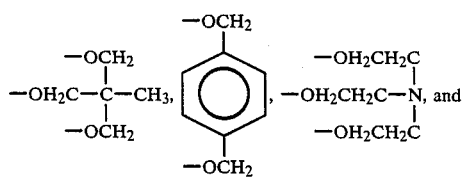

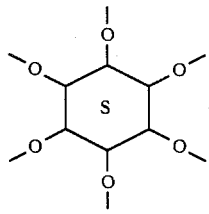

6. A polymer having the formula:

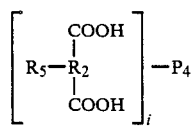

wherein $R_5$ is

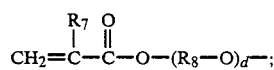

$R_7$ is hydrogen, methyl or ethyl; $R_8$ is a straight or branched chain alkyl group of from 1 to 6 carbon atoms; d is an integer from 1 to 10; $R_2$ comprises

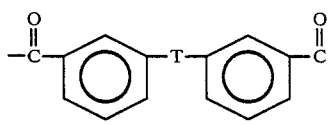

wherein T is selected from the group consisting of

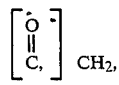

S, O, and $SO_2$; i is an integer from 2–6; and $P_4$ is selected from the group consisting of polyether, polyester, polycarbonate, and mixtures thereof comprising from 1 to 50 repeating units.

* * * * *